United States Patent
Fujii et al.

(10) Patent No.: US 10,020,661 B2
(45) Date of Patent: Jul. 10, 2018

(54) VOLTAGE DETECTION DEVICE AND EQUALIZATION DEVICE

(71) Applicant: Yazaki Corporation, Minato-ku, Tokyo (JP)

(72) Inventors: Hironao Fujii, Susono (JP); Takaaki Izawa, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 283 days.

(21) Appl. No.: 14/595,943

(22) Filed: Jan. 13, 2015

(65) Prior Publication Data

US 2015/0162759 A1 Jun. 11, 2015

Related U.S. Application Data

(63) Continuation of application No. PCT/JP2013/075267, filed on Sep. 19, 2013.

(30) Foreign Application Priority Data

Sep. 21, 2012 (JP) .................................. 2012-208480

(51) Int. Cl.
*H02J 7/00* (2006.01)
*H01M 10/42* (2006.01)
(Continued)

(52) U.S. Cl.
CPC ............ *H02J 7/0016* (2013.01); *G01R 35/00* (2013.01); *H01M 10/425* (2013.01);
(Continued)

(58) Field of Classification Search
CPC .............................. H02J 7/0014; H02J 7/0016
(Continued)

(56) References Cited

U.S. PATENT DOCUMENTS 8,836,340 B2 9/2014 Aoki et al.
2004/0155629 A1 8/2004 Kobayashi et al.
(Continued)

FOREIGN PATENT DOCUMENTS

EP 2595275 A1 5/2013
JP 2010-243157 A 10/2010
(Continued)

OTHER PUBLICATIONS

Apr. 1, 2016—(EP) Extended Search Report—App 13838402.9.
(Continued)

*Primary Examiner* — Drew A Dunn
*Assistant Examiner* — Zixuan Zhou
(74) *Attorney, Agent, or Firm* — Banner & Witcoff, Ltd.

(57) ABSTRACT

A voltage detection device for detecting a voltage across both ends of each of plural unit batteries which are connected to each other in series. The voltage detection device includes lowpass filters which are connected to the respective unit batteries, a first voltage detector which detects a voltage across both ends of each of the unit batteries that is supplied via a corresponding lowpass filter, a second voltage detector which detects a voltage across both ends of each of the unit batteries that is supplied without passage through the corresponding lowpass filter, and a failure detector which detects whether the lowpass filter is failing by comparing a voltage detection value detected by the first voltage detector with a voltage detection value detected by the second voltage detector.

2 Claims, 4 Drawing Sheets

(51) Int. Cl.
  *H01M 10/48* (2006.01)
  *G01R 35/00* (2006.01)
  *G01R 31/36* (2006.01)
  *G01R 19/165* (2006.01)

(52) U.S. Cl.
  CPC ......... *H01M 10/482* (2013.01); *H02J 7/0021* (2013.01); *G01R 19/16542* (2013.01); *G01R 31/3658* (2013.01); *Y02T 10/7055* (2013.01)

(58) Field of Classification Search
  USPC .................................. 320/116–119; 324/426
  See application file for complete search history.

(56) References Cited

U.S. PATENT DOCUMENTS

| | | |
|---|---|---|
| 2010/0271052 A1 | 10/2010 | Ishikawa et al. |
| 2012/0139553 A1* | 6/2012 | Nortman ............... H02J 7/0016 324/537 |
| 2012/0146652 A1 | 6/2012 | Aoki et al. |
| 2012/0176160 A1 | 7/2012 | Sugimura |
| 2012/0194199 A1 | 8/2012 | Mizoguchi |
| 2013/0162213 A1 | 6/2013 | Izawa |
| 2013/0335095 A1* | 12/2013 | Kiuchi .................. H01M 10/48 324/426 |

FOREIGN PATENT DOCUMENTS

| | | |
|---|---|---|
| JP | 2011-007554 A | 1/2011 |
| JP | 2012-122856 A | 6/2012 |
| JP | 2012-137334 A | 7/2012 |
| JP | 2012-147587 A | 8/2012 |
| JP | 2012-173334 A | 9/2012 |
| JP | 2013-094032 A | 5/2013 |
| WO | 2012-132220 A1 | 10/2012 |

OTHER PUBLICATIONS

Sep. 20, 2016—(JP) Notification of Reasons for Refusal—App 2012-208480, Eng Tran.
Dec. 10, 2013—(WO) Written Opinion of the ISA—App PCT/JP2013/075267, Eng Tran.
Dec. 10, 2013—International Search Report—Intl App PCT/JP2013/075267—English Translation.
Feb. 28, 2017—(JP) Notification of Reasons for Refusal—App 2012-208480, Eng Tran.

* cited by examiner

VOLTAGE DETECTION DEVICE AND EQUALIZATION DEVICE

CROSS REFERENCE TO RELATED APPLICATIONS

This application is a continuation of PCT application No. PCT/JP2013/075267, which was filed on Sep. 19, 2013 based on Japanese Patent Application (No. P2012-208480) filed on Sep. 21, 2012, the contents of which are incorporated herein by reference.

BACKGROUND OF THE INVENTION

1. Field of the Invention

The present invention relates to a voltage detection device and an equalization device. More particularly, the invention relates to a voltage detection device and an equalization device which detect a voltage across the both ends of each of plural unit batteries that are connected to each other in series.

2. Description of the Related Art

Battery assemblies mounted in, for example, hybrid vehicles and electric vehicles are composed of plural unit batteries that are connected to each other in series. A high voltage of 200 V, for example, appears between their both ends and generated power is supplied to a drive motor. In such battery assemblies, if a variation occurs between the voltages across the pairs of ends of the respective unit batteries, they may be reduced in the efficiency of use or charged excessively. In view of this, equalization devices have been proposed which detect a voltage across the both ends of each of the unit batteries and the voltages across the pairs of ends of the respective unit batteries are equalized on the basis of detection results using discharge resistors etc.

Such equalization devices are composed of battery monitoring ICs each of which incorporates, among other things, Analog-to-Digital converters for detecting voltages across the pairs of ends of the unit batteries, respectively. To increase the voltage detection accuracy of the battery monitoring ICs, a lowpass filter (hereinafter abbreviated as LPF) is provided between each unit battery and the associated Analog-to-Digital converter to cut high-frequency noise.

However, in the above conventional technique, when an LPF fails, it may be impossible to detect the LPF failure depending on its type. More specifically, in the case of a failure that the output voltage of an LPF decreases markedly in a short time due to, for example, breaking of a resistor of the LPF that results in its opening, the LPF failure can be detected on the basis of a detection result of the voltage across the both ends of the unit battery. On the other hand, in the case of a failure that the output of an LPF decreases gradually over a long time due to, for example, a leak failure of a capacitor, the LPF failure cannot be discriminated clearly from degradation of the characteristic of the unit battery itself and hence it is difficult to detect the LPF failure soon after its occurrence. Where an LPF failure cannot be detected promptly as in the latter case, a detection value of the unit battery is lower than an actual value until detection of the failure, possibly lowering the efficiency of use of the battery or causing its overcharging.

The technique disclosed in JP-A-2012-122856 has been proposed as a technique for detecting disconnection of an LPF. However, although the device disclosed in JP-A-2012-122856 can detect disconnection of an LPF, it cannot detect a leak failure of a capacitor.

SUMMARY OF THE INVENTION

The present invention has been made in the above circumstances, and an object of the present invention is therefore to provide a voltage detection device and an equalization device which can detect a failure including a leak failure of the capacitor of a lowpass filter.

Means for Solving the Problems

To solve the above problems, a first aspect of the invention provides a voltage detection device for detecting a voltage across the both ends of each of plural unit batteries that are connected to each other in series, comprising lowpass filters which are connected to the respective unit batteries and each of the lowpass filters cuts a high-frequency component of a voltage across the both ends of the corresponding unit battery; a first voltage detector which is connected to the lowpass filters connected to the respective unit batteries and detects a voltage across the both ends of each of the unit batteries that is supplied via the corresponding lowpass filter; a second voltage detector which detects a voltage across the both ends of each of the unit batteries that is supplied without passage through the corresponding lowpass filter; and a failure detector which detects whether the lowpass filter is in failure by comparing a detection value detected by the first voltage detector with a detection value detected by the second voltage detector.

A second aspect of the invention provides a voltage detection device, wherein the first voltage detector and the second voltage detector of the voltage detection device according to the first aspect of the invention are formed by a single Analog-to-Digital converter; and the voltage detection device further comprises a switching unit which switches the voltage to be input to the Analog-to-Digital converter among the voltages of the unit batteries that are supplied via the lowpass filters and the voltages of the unit batteries that are supplied without passage through the lowpass filters.

A third aspect of the invention provides an equalization device comprising the voltage detection device according to the first or second aspect of the invention, discharge resistors which are connected to connecting points of the unit batteries and the lowpass filters, respectively; and equalization switches each of which is disposed between the both ends of the corresponding unit battery and connected to the corresponding discharge resistor in series, wherein the second voltage detector detects, as a voltage of each of the unit batteries that is supplied without passage through the corresponding lowpass filter, a voltage at a connecting point of the corresponding discharge resistor and the corresponding equalization switch.

Advantages of the Invention

As described above, in the first aspect, the failure detector detects whether or not the lowpass filters are in failure by comparing detection values detected by the first voltage detector, that is, detection values detected via the lowpass filters, with detection values detected by the second voltage detector, that is, detection values detected without passage through the lowpass filters. Therefore, a failure including a leak failure of a lowpass filter can be detected.

In the second aspect, the switching unit switches the voltage to be input to the Analog-to-Digital converter among voltages of the unit batteries that are supplied via the lowpass filters and voltages of the unit batteries that are supplied without passage through the lowpass filters. Therefore, the first voltage detector and the second voltage detector can be formed by a single Analog-to-Digital converter and hence cost reduction can be attained.

In the third aspect, whether each equalization switch is turned on or off can be judged on the basis of a voltage at the connecting point of the corresponding discharge resistor and the equalization switch. Therefore, whether a circuit for on/off-controlling the equalization switches can also be detected.

DETAILED DESCRIPTION OF THE EXEMPLARY EMBODIMENTS

Figure 1:
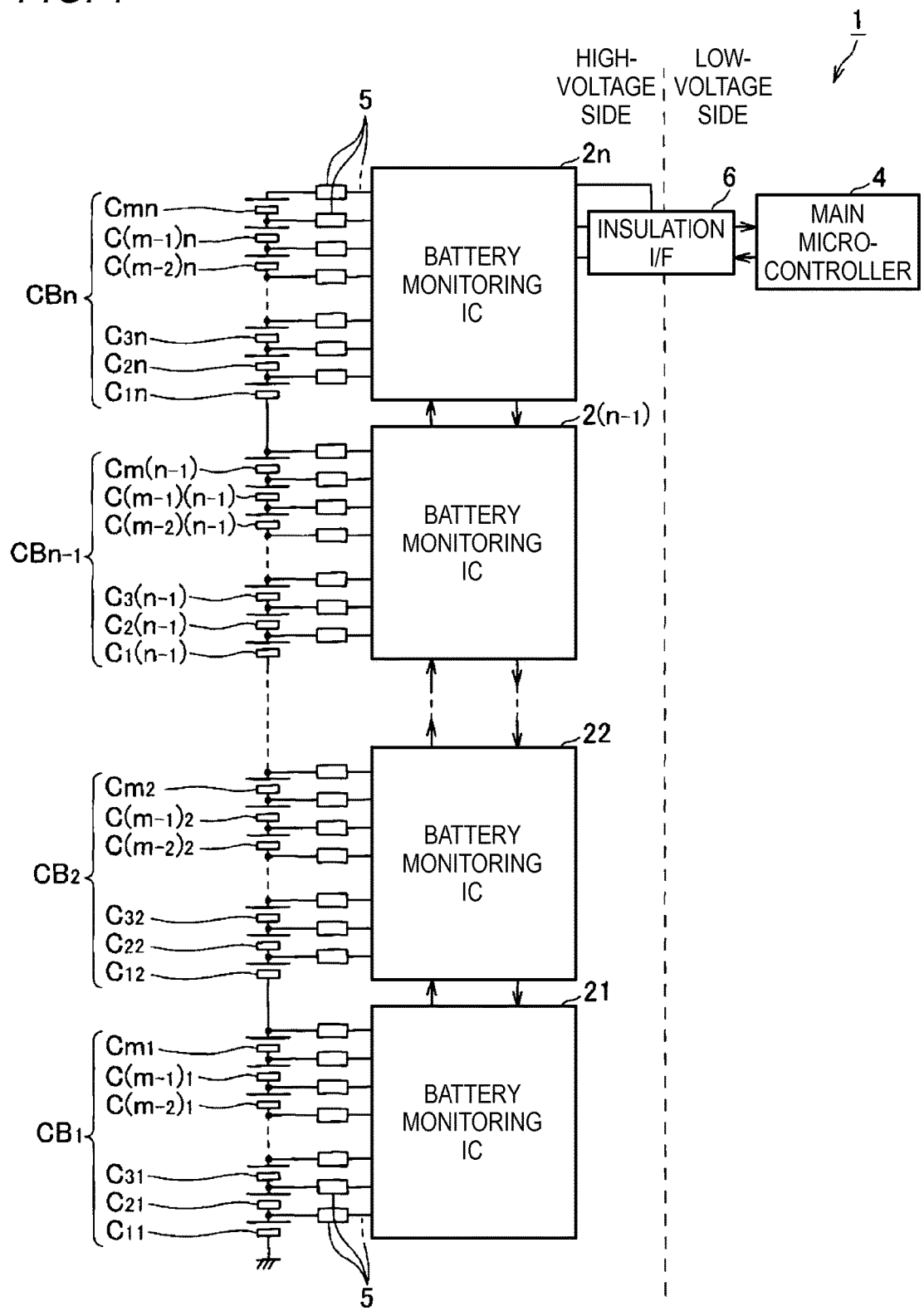
FIG. 1 is a block diagram showing an embodiment a voltage detection unit which is part of an equalization device according to the present invention.

An embodiment of an equalization device incorporating a voltage detection device according to the present invention will be hereinafter described with reference to FIGS. 1-4. As shown in FIG. 1, an equalization device 1 is a device for equalizing the voltages across pairs of ends of plural unit batteries $C_{11}$-$C_{mn}$ that constitute a battery assembly BH and are connected to each other in series. Although in the embodiment each of the unit batteries $C_{11}$-$C_{mn}$ is a single secondary battery, it may consist of plural secondary batteries.

For example, the battery assembly BH is used as a power source of an electric motor of a hybrid electric vehicle which employs, as running drive sources, an engine and the electric motor (neither of which are shown). Not only is the electric motor connected to the both ends of the battery assembly BH as a load when necessary but also an alternator or the like (not shown) is connected to the both ends of the battery assembly BH as a charger when necessary. The unit batteries $C_{11}$-$C_{mn}$ are divided into n blocks $CB_1$-$CB_n$. That is, the battery assembly BH has the n blocks $CB_1$-$CB_n$. Each of the blocks $CB_1$-$CB_n$ consists of m unit batteries.

The equalization device 1 is equipped with a voltage detection unit 2 (see FIG. 1) which is a voltage detection device for detecting a voltage across the both ends of each of the unit batteries $C_{11}$-$C_{mn}$, an equalization unit 3 (see FIG. 2) which performs equalization by discharging each of the unit batteries $C_{11}$-$C_{mn}$ using a discharge resistance Rd, and a main microcontroller 4 which controls the whole device and also controls the equalization unit 3 on the basis of detection results of the voltage detection unit 2.

As shown in FIG. 1, the voltage detection unit 2 is equipped with n battery monitoring ICs 21-2n which are provided so as to correspond to the respective blocks $CB_1$-$CB_n$ and plural lowpass filters (hereinafter abbreviated as LPFs) 5 each of which is provided between the positive side (one end side) of one of the unit batteries $C_{11}$-$C_{mn}$ and the associated one of the battery monitoring ICs 21-2n. Each of the battery monitoring ICs 21-2n detects voltages across the pairs of ends of the corresponding ones, constituting the corresponding one of the blocks $CB_1$-$CB_n$, of the unit batteries $C_{11}$-$C_{mn}$, and sends the detected voltages to the main microcontroller 4.

Figure 3:
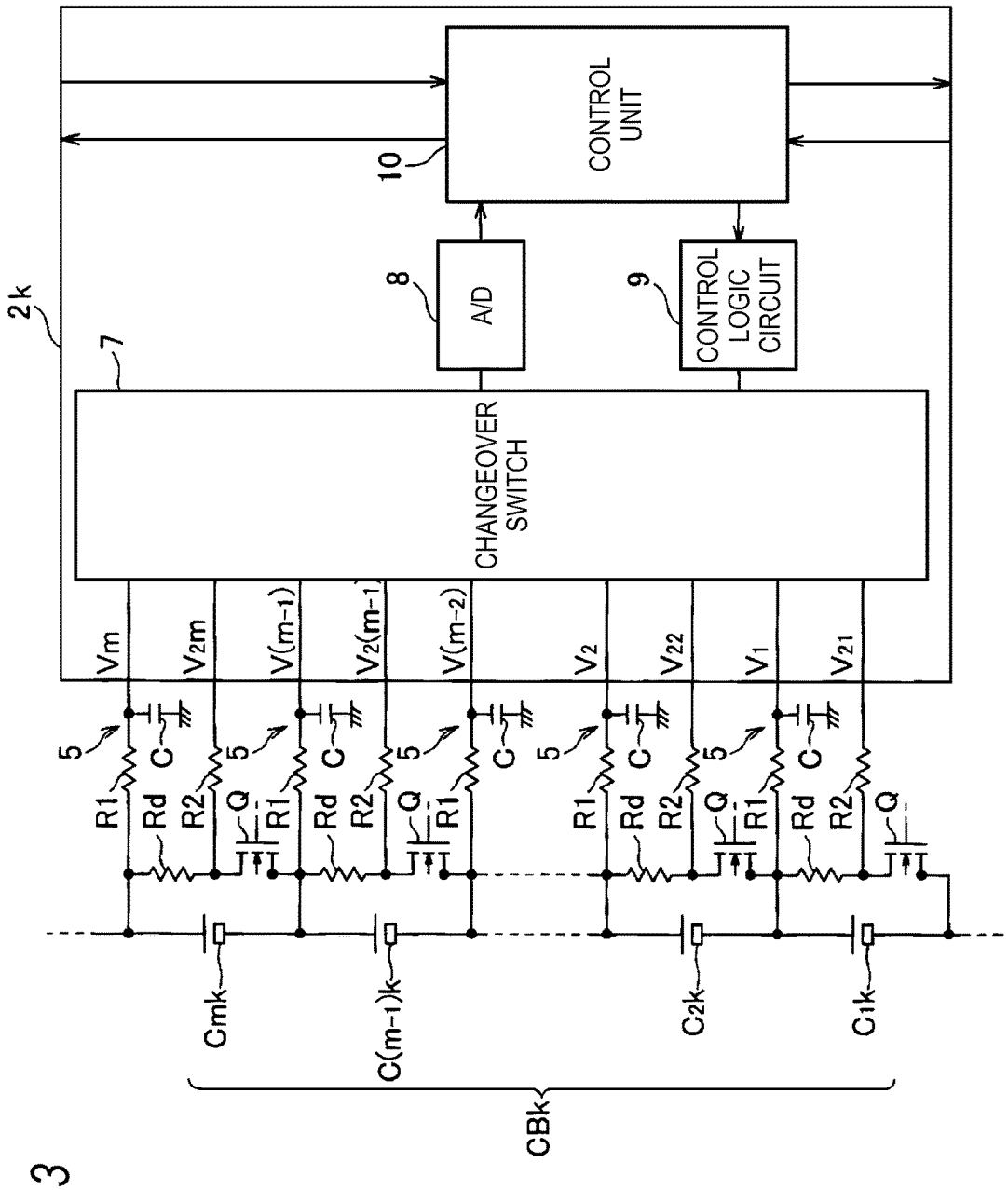
FIG. 3 shows details of battery monitoring ICs which are part of the equalization device shown in FIG. 1.

The battery monitoring ICs 21-2n are connected to each other in cascade, and only the battery monitoring IC 2n which is connected to a highest potential can directly communicate with the main microcontroller 4 (via an insulation I/F 6). Each of the battery monitoring ICs 21-2(n−1) other than the highest-potential battery monitoring IC 2n communicates with the main microcontroller 4 via the battery monitoring ICs that are located on the high potential side of itself. As shown in FIG. 3, each LPF 5 is what is called a CR filter which consists of a resistor R1 and a capacitor C. The resistor R1 is connected between the positive side of the corresponding one of the unit batteries $C_{11}$-$C_{mn}$ and the corresponding one of the battery monitoring ICs 21-2n. The capacitor C is connected between the connecting point of the resistor R1 and the corresponding one of the battery monitoring ICs 21-2n and the negative electrode of the corresponding one of the blocks $CB_1$-$CB_n$. Provided between the corresponding one of the unit batteries $C_{11}$-$C_{mn}$ and the corresponding one of the battery monitoring ICs 21-2n, each LPF 5 cuts a high-frequency component of the positive-side voltage of the corresponding one of the unit batteries $C_{11}$-$C_{mn}$ and supplies a resulting voltage to the corresponding one of the battery monitoring ICs 21-2n. Although in the embodiment each capacitor C is connected to the negative electrode of the corresponding one of the blocks $CB_1$-$CB_n$, each capacitor C may be connected to the connecting point of the resistor R1 that is connected to the one-unit-voltage-lower unit battery and the corresponding one of the battery monitoring ICs 21-2n.

Figure 2:
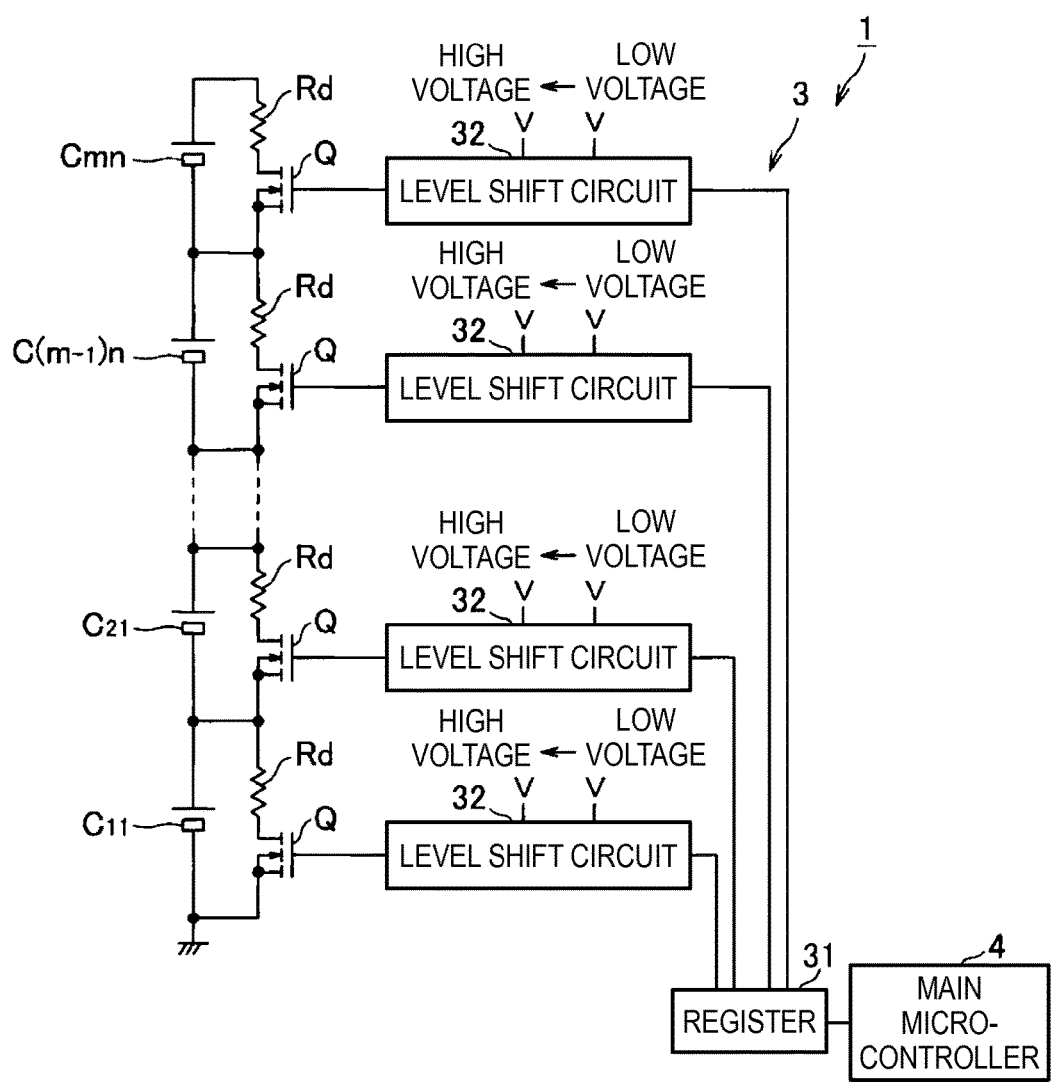
FIG. 2 is a block diagram of an equalization unit which is part of the equalization device shown in FIG. 1.

As shown in FIG. 2, the equalization unit 3 is equipped with plural discharge resistors Rd which are provided so as to correspond to the respective unit batteries $C_{11}$-$C_{mn}$, plural equalization switches Q each of which is series-connected to the associated discharge resistor Rd (the series connection is provided between the both ends of the corresponding one of the unit batteries $C_{11}$-$C_{mn}$), a register 31, and level shift circuits 32. The equalization switches Q are field-effect transistors, for example. When each equalization switch Q is turned on, the discharge resistor Rd is connected to the both ends of the corresponding one of the unit batteries $C_{11}$-$C_{mn}$. On the other hand, when each equalization switch Q is turned off, the discharge resistor Rd is disconnected from the corresponding one of the unit batteries $C_{11}$-$C_{mn}$, whereby discharge of the corresponding one of the unit batteries $C_{11}$-$C_{mn}$ is stopped.

The register 31 temporarily stores an on/off signal for the equalization switches Q that is transmitted from the main microcontroller 4 and sends resulting on/off signals to the respective equalization switches Q in parallel. The main microcontroller 4 outputs on/off signal which has a bit sequence whose number of bits is equal to the number of unit batteries $C_{11}$-$C_{mn}$ and in which bits corresponding to part, judged to require discharge, of the unit batteries $C_{11}$-$C_{mn}$ are given a value "1" and bits corresponding to part, judged not to require discharge, of the unit batteries $C_{11}$-$C_{mn}$ are given a value "0." More specifically, if only the unit battery $C_{11}$ should be discharged, an on/off signal having a bit sequence "10 . . . 00" whose bits (MSB to LSB) correspond to the respective unit batteries $C_{11}$-$C_{mn}$ in order.

Since each on/off signal that is output from the register 31 has a voltage generated on the basis of the voltage of a low-voltage battery that is a power source of the main microcontroller 4, the corresponding equalization switch Q cannot be on/off-controlled if the on/off signal is input to the gate of the equalization switch Q as it is. In view of this, each on/off signal that is output from the register 31 is output to the corresponding equalization switch Q after being converted by the corresponding level shift circuit 32 into a voltage having such a level as to be able to turn on or off the corresponding equalization switch Q. If receiving a voltage-level-converted on/off signal "1" (H level), an equalization switch Q is turned on and discharges the corresponding one of the unit batteries $C_{11}$-$C_{mn}$. Although in the embodiment each equalization switch Q is turned on and discharges the corresponding one of the unit batteries $C_{11}$-$C_{mn}$ when receiving an on/off signal "1" (H level), each equalization switch Q may be configured (e.g., by using a p-channel field effect transistor) so as to be turned on and discharge the one, connected to it, of the unit batteries $C_{11}$-$C_{mn}$. As for the driving method of the equalization switches Q, although voltage driving is employed in the embodiment, current driving may be employed.

Next, detailed configurations of the battery monitoring ICs 21-2n which have been outlined above will be described with reference to FIG. 3. Since the battery monitoring ICs 21-2n have equivalent configurations, the following description will be directed to an arbitrary, representative battery monitoring IC 2k (k: any integer selected from 1 to m). As shown in FIG. 3, the battery monitoring IC 2k is equipped with terminals $V_1$-$V_m$ to which the positive sides of the unit batteries $C_{1k}$-$C_{mk}$ are connected via the LPFs 5, respectively, and terminals $V_2$-$V_{2m}$ to which the connecting points of the discharge resistors Rd and the equalization switches Q are connected via resistors R2, respectively. That is, positive-side voltages of the unit batteries $C_{11}$-$C_{mn}$ are supplied to the terminals $V_1$-$V_m$ past the LPFs 5 and the positive-side voltages of the unit batteries $C_{11}$-$C_{mn}$ before passage through the LPFs 5 are supplied to the terminals $V_2$-$V_{2m}$.

The battery monitoring IC 2k is also equipped with a changeover switch 7 which is a switching unit for connecting one of the terminals $V_1$-$V_m$ and the terminals $V_2$-$V_{2m}$ to the input of an A/D converter 8, the A/D converter 8 which is a first voltage detector and a second voltage detector for converting a received analog voltage to a digital voltage and sends the latter to the main microcontroller 4, a control logic circuit 9 for controlling the changeover switch 7, and a control unit 10 for controlling the A/D converter 8 and the control logic circuit 9.

Figure 4:
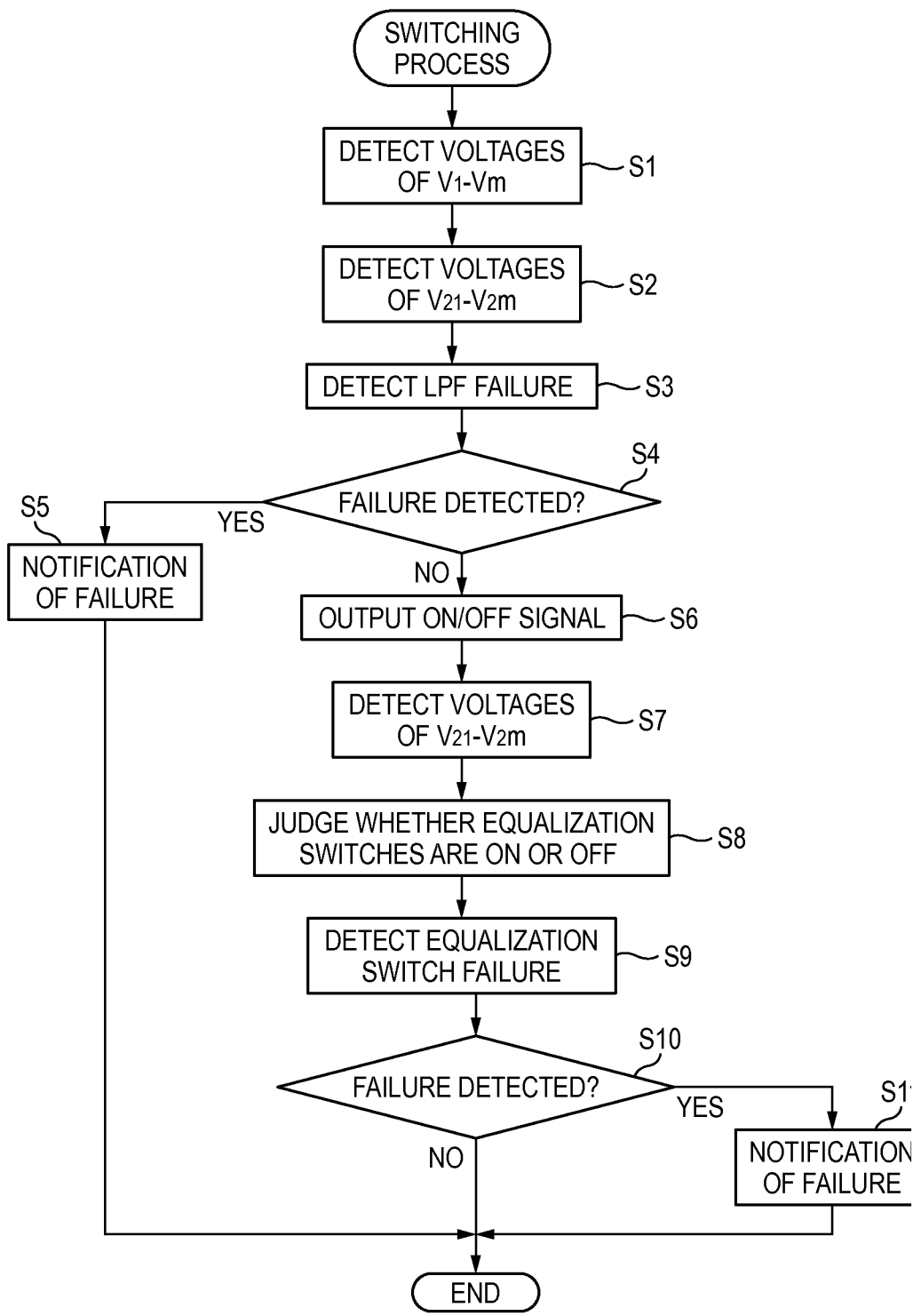
FIG. 4 is a flowchart showing a processing procedure of a main microcontroller shown in FIG. 1.

Next, how the equalization device 1 having the above-described configuration operates will be described with reference to FIG. 4. The main microcontroller 4 starts equalization processing in response to a trigger such as turning-on or off of an ignition switch. First, the main microcontroller 4 outputs first voltage detection instructions to the battery monitoring ICs 21-2n sequentially and thereby causes them to detect positive-side voltages of the unit batteries $C_{11}$-$C_{mn}$ after passage through the LPFs 5 (step S1).

Upon receiving the first voltage detection instruction, the control unit 10 of each of the battery monitoring ICs 21-2n judges whether the received first voltage detection instruction is directed to itself. If the received first voltage detection instruction is not directed to itself, the control unit 10 sends the received first voltage detection instruction to the adjacent one (on the low potential side) of the battery monitoring ICs 21-2n(n-1). On the other hand, if the received first voltage detection instruction is directed to itself, the control unit 10 controls the control logic circuit 9 to cause the changeover switch 7 to connect the terminals $V_1$-$V_m$ to the input of the A/D converter 8 sequentially. As a result, the A/D converter 8 sequentially A/D-converts voltages that are input to the terminals $V_1$-$V_m$ and the control unit 10 sends resulting voltages to the main microcontroller 4 sequentially as detection voltages. The detection voltages are transmitted directly from the battery monitoring IC 2n to the main microcontroller 4. The detection voltages are transmitted from each of the battery monitoring ICs 21-2(n-1) to the main microcontroller 4 via the ones, located on the high potential side, of the battery monitoring ICs 22-2n. In this manner, the positive-side voltages of the unit batteries $C_{11}$-$C_{mn}$ after passage through the LPFs 5 are sent to the main microcontroller 4 sequentially.

Then, the main microcontroller 4 outputs second voltage detection instructions to the respective battery monitoring ICs 21-2n sequentially and thereby causes them to detect positive-side voltages of the unit batteries $C_{11}$-$C_{mn}$ before passage through the LPFs 5 (step S2). Upon receiving the second voltage detection instruction, the control unit 10 of each of the battery monitoring ICs 21-2n judges whether the received second voltage detection instruction is directed to itself. If the received second voltage detection instruction is not directed to itself, the control unit 10 sends the received second voltage detection instruction to the adjacent one (on the low potential side) of the battery monitoring ICs 21-2n (n-1). On the other hand, if the received second voltage detection instruction is directed to itself, the control unit 10 controls the control logic circuit 9 to cause the changeover switch 7 to connect the terminals $V_{21}$-$V_{2m}$ to the input of the A/D converter 8 sequentially. As a result, the A/D converter 8 sequentially A/D-converts voltages that are input to the terminals $V_{21}$-$V_{2m}$ and the control unit 10 sends resulting voltages to the main microcontroller 4 sequentially as detection voltages. The detection voltages are transmitted directly from the battery monitoring IC 2n to the main microcontroller 4. The detection voltages are transmitted from each of the battery monitoring ICs 21-2(n-1) to the main microcontroller 4 via the ones, located on the high potential side, of the battery monitoring ICs 22-2n. In this manner, the positive-side voltages of the unit batteries $C_{11}$-$C_{mn}$ before passage through the LPFs 5 are sent to the main microcontroller 4 sequentially.

Then, the main microcontroller 4 operates as a failure detector. That is, the main microcontroller 4 detects whether or not the LPFs 5 are in failure by comparing the positive-side voltages of the unit batteries $C_{11}$-$C_{mn}$ after passage through the LPFs 5 with their positive-side voltages before passage through the LPFs 5, respectively (step S3). If each LPF 5 is free of an open failure, a leak failure, or the like, the positive-side voltage of the corresponding one of the unit batteries $C_{11}$-$C_{mn}$ after passage through the LPF 5 should have approximately the same value as the positive-side voltage of the corresponding one of the unit batteries $C_{11}$-$C_{mn}$ before passage through the LPF 5.

If a failure is found (step S4: Y), the main microcontroller 4 informs, of that fact, a higher-level system (not shown) that exists at a higher level in the commanding system than the main microcontroller 4 (step S5) and finishes the processing. If no failure is found (step S4: N), the main microcontroller 4 calculates voltages across the pairs of ends of the unit batteries $C_{11}$-$C_{mn}$ from the positive-side voltages of the unit batteries $C_{11}$-$C_{mn}$ after passage through the LPFs 5. Comparing the calculated voltages with each other, the main microcontroller 4 outputs an on/off signal for discharging ones, having high voltages across the pairs of ends, of the unit batteries $C_{11}$-$C_{mn}$ (step S6). The on/off signal is input to the equalization switches Q via the register 31 and the level shift circuits 32, whereby equalization switches Q corresponding to the ones, having high voltages across the pairs of ends, of the unit batteries $C_{11}$-$C_{mn}$ are turned on and those ones of the unit batteries $C_{11}$-$C_{mn}$ are discharged.

Then, the main microcontroller 4 again outputs second voltage detection instructions to the battery monitoring ICs $2_1$-$2_n$ sequentially and thereby causes them to detect voltages at the connecting points between the discharge resistors Rd and the equalization switches Q, respectively (step S7). If receiving a second voltage detection instruction that is directed to itself, the control unit 10 controls the control logic circuit 9 to cause the changeover switch 7 to connect the terminals $V_{21}$-$V_{2m}$ to the input of the A/D converter 8 sequentially. The A/D converter 8 sequentially A/D-converts voltages that are input to the terminals $V_{21}$-$V_{2m}$ and the control unit 10 sends resulting voltages to the main microcontroller 4 sequentially as detection voltages. In this manner, the voltages at the connecting points between the discharge resistors Rd and the equalization switches Q are sent to the main microcontroller 4 sequentially. These connecting point voltages are approximately equal to the positive-side voltages of the unit batteries $C_{11}$-$C_{mn}$ when the equalization switches Q are off, respectively, and are approximately equal to the negative-side voltages of the unit batteries $C_{11}$-$C_{mn}$ when the equalization switches Q are off, respectively. Therefore, whether the equalization switches Q are on or off can be judged on the basis of the respective connecting point voltages.

Then, the main microcontroller 4 judges whether the equalization switches Q are on or off on the basis of the respective connecting point voltages (step S8). The main microcontroller 4 detects whether or not each equalization switch Q is in failure by comparing the on/off judgment result for it obtained at step S8 with the on/off signal that was output to it at step S6 (step S9). If detecting an equalization switch Q in failure (step S10: Y), the main microcontroller 4 informs the higher-level system (not shown) of that fact (step S11) and finishes the processing. On the other hand, if detecting no equalization switch Q in failure (step S10: N), the main microcontroller 4 finishes the processing immediately.

In the above-described embodiment, the main microcontroller 4 detects whether or not the LPFs 5 are in failure by comparing positive-side voltage detection values of the unit batteries $C_{11}$-$C_{mn}$ after passage through the LPFs 5 with positive-side voltage detection values of the unit batteries $C_{11}$-$C_{mn}$ before passage through the LPFs 5, respectively. Therefore, a failure including a leak failure of the capacitor C of an LPF 5 can be detected.

In the above-described embodiment, the changeover switch 7 switches the voltage to be input to the A/D converter 8 among positive-side voltages of the unit batteries $C_{11}$-$C_{mn}$ after passage through the LPFs 5 and positive-side voltages of the unit batteries $C_{11}$-$C_{mn}$ before passage through the LPFs 5. Therefore, the first voltage detector and the second voltage detector can be formed by the single A/D converter 8, whereby cost reduction can be attained.

Furthermore, in the above-described embodiment, voltages at connecting points of the discharge resistors Rd and the equalization switches Q are detected as voltages across the pairs of ends of the unit batteries $C_{11}$-$C_{mn}$ before passage through the LPFs 5, respectively. Therefore, during discharge, whether each equalization switch Q is turned on or off can be judged on the basis of the voltage thus detected. As a result, whether or not the equalization unit 3 which controls the turning-on/off of the equalization switch Q is in failure can also be detected.

Although in the above-described embodiment whether or not the equalization unit 3 is in failure is detected, this is not an essential feature; whether or not the equalization unit 3 is in failure need not always be detected.

In the above-described embodiment, positive-side voltages of the unit batteries $C_{11}$-$C_{mn}$ after passage through the LPFs 5 and positive-side voltages of the unit batteries $C_{11}$-$C_{mn}$ before passage through the LPFs 5 are A/D-converted by the single A/D converter 8, the invention is not limited to such a case. Positive-side voltages of the unit batteries $C_{11}$-$C_{mn}$ after passage through the LPFs 5 and positive-side voltages of the unit batteries $C_{11}$-$C_{mn}$ before passage through the LPFs 5 may be A/D-converted by different A/D converters 8.

In the above-described embodiment, the highest-potential-side battery monitoring IC $2_n$ is connected directly to the main microcontroller 4 (via the insulation I/F) 6, the invention is not limited to such a case. For example, lowest-potential-side battery monitoring IC $2_1$ may be connected to the main microcontroller 4 (via the insulation I/F 6). And microcontrollers may be provided for the respective battery monitoring ICs.

Although in the above-described embodiment the main microcontroller 4 is used as the failure detector, the battery monitoring ICs may serve as the failure detector.

The above-described embodiment is just a typical form of the invention and the invention is not limited to the embodiment. That is, various modifications are possible without departing from the gist of the invention.

The features of the embodiment of the voltage detection device and the equalization device according to the invention will be summarized below concisely in the form of items [1]-[3]:

[1] A voltage detection device (1) for detecting a voltage across the both ends of each of plural unit batteries ($C_{11}$-$C_{mn}$) which are connected to each other in series, the voltage detection device comprising:

lowpass filters (LPFs 5) which are connected to the respective unit batteries and each of the lowpass filters cuts a high-frequency component of a voltage across the both ends of the corresponding unit battery;

a first voltage detector (A/D converter 8) which is connected to the lowpass filter connected to each of the unit batteries and detects a voltage across the both ends of the unit battery that is supplied via the lowpass filter;

second voltage detector (A/D converter 8) which detects a voltage across the both ends of each of the unit batteries that is supplied without passage through the corresponding lowpass filter; and a failure detector (main microcontroller 4) which detects whether the lowpass filter is in failure by comparing a detection value detected by the first voltage detector with a detection value detected by the second voltage detector.

[2] The voltage detection device according to item [1], wherein the first voltage detector and the second voltage detector are formed by a single Analog-to-Digital converter (8); and the voltage detection device further comprising:

a switching unit (changeover switch 7) which switches the voltage to be input to the Analog-to-Digital converter among the voltages of the unit batteries that are supplied via the lowpass filters and the voltages of the unit batteries that are supplied without passage through the lowpass filters.

[3] An equalization device comprising:

the voltage detection device according to item [1] or [2], discharge resistors (discharge resistors Rd) which are connected to connecting points of the unit batteries and the lowpass filters, respectively; and equalization switches (equalization switches Q) each of which is disposed between the both ends of the corresponding unit battery and connected to the corresponding discharge resistor in series, wherein:

the second voltage detector detects, as a voltage of each of the unit batteries that is supplied without passage through the corresponding lowpass filter, a voltage at the connecting point of the corresponding discharge resistor and the corresponding equalization switch.

Although the invention has been described in detail by referring to the particular embodiment, it is apparent to those skilled in the art that various changes and modifications are possible without departing from the spirit and scope of the invention.

The voltage detection device and the equalization device according to the invention can detect a failure including a leak failure of the capacitor of a lowpass filter. With this advantage, the invention is useful when applied to the field of voltage detection devices and equalization devices which detect a voltage across the both ends of each of plural unit batteries that are connected to each other in series.

The invention claimed is:

1. An equalization device comprising:
    a voltage detection device for detecting a voltage across both ends of each of plural unit batteries which are connected to each other in series;
    a single Analog-to-Digital converter which detects a voltage across both ends of each of the unit batteries in a first state;
    lowpass filters which are connected between each of the unit batteries and the single Analog-to-Digital converter in the first state, each of the lowpass filters cutting a high-frequency component of a voltage across both ends of a corresponding unit battery and supplying the voltage to the single Analog-to-Digital converter in the first state;
    discharge resistors which are connected to connecting points of the unit batteries and the lowpass filters, respectively;
    equalization switches each of which is disposed between the both ends of the corresponding unit battery and connected to a corresponding discharge resistor in series;
    an equalization controller which outputs an on/off signal to the equalization switches to conduct equalizing by the discharge resistors;
    the single Analog-to-Digital converter detecting, in a second state, a connecting point voltage between discharge resistors and the equalization switches, as a voltage detection value of each of the unit batteries that is supplied without passage through the corresponding lowpass filter; and
    a filter failure detector which detects whether the lowpass filter is failing by comparing a voltage detection value detected by the single Analog-to-Digital converter in the first state with a voltage detection value detected by the single Analog-to-Digital converter in the second state; and
    an equalization switch failure detector which detects whether the equalization switches are failing based on the voltage detection value detected by the single Analog-to-Digital converter in the second state when the equalization controller conducts an equalizing operation,
    wherein the first state is a state that a first terminal connecting to a positive side of each of the unit batteries via the lowpass filter is connected to the single Analog-to-Digital converter, and that a second terminal connecting to a connecting point of each of the discharge resistors and each of the equalization switches via a resistor is not connected to the single Analog-to-Digital converter,
    wherein the second state is a state that the first terminal connecting to the positive side of each of the unit batteries via the lowpass filter is not connected to the single Analog-to-Digital converter, and that the second terminal connecting to the connecting point of each of the discharge resistors and each of the equalization switches via the resistor is connected to the single Analog-to-Digital converter, and
    wherein the equalizing operation includes comparing voltages across pairs of ends of the unit batteries with each other, and outputting on or off signals to discharge unit batteries having high voltages across the pairs of ends.

2. The equalization device according to claim 1, wherein the voltage detection device further comprises:
    a switch unit which switches the voltage to be input to the single Analog-to-Digital converter among the voltages of the unit batteries that are supplied via the lowpass filters to the plurality of first terminals and the voltages of the unit batteries that are supplied without passage through the lowpass filters to the plurality of second terminals.

* * * * *